US010288687B2

(12) United States Patent
Balka

(10) Patent No.: US 10,288,687 B2
(45) Date of Patent: May 14, 2019

(54) METHOD AND DEVICE FOR TESTING A TEMPERATURE-COMPENSATED, PRESSURE-GRADIENT-CONTROLLED PRESSURE SWITCH

(71) Applicant: Lufthansa Technik AG, Hamburg (DE)

(72) Inventor: Matthias Balka, Hamburg (DE)

(73) Assignee: LUFTHANSA TECHNIK AG, Hamburg (DE)

( * ) Notice: Subject to any disclaimer, the term of this patent is extended or adjusted under 35 U.S.C. 154(b) by 79 days.

(21) Appl. No.: 15/331,322

(22) Filed: Oct. 21, 2016

(65) Prior Publication Data

US 2017/0115354 A1 Apr. 27, 2017

(30) Foreign Application Priority Data

Oct. 21, 2015 (DE) .................. 10 2015 220 529

(51) Int. Cl.
*G01R 31/327* (2006.01)
*G01R 31/02* (2006.01)
(Continued)

(52) U.S. Cl.
CPC ......... *G01R 31/3277* (2013.01); *G01F 22/00* (2013.01); *G01L 27/007* (2013.01);
(Continued)

(58) Field of Classification Search
CPC ... G01R 31/3277; G01R 31/026; G01F 22/00; G01M 99/008
(Continued)

(56) References Cited

U.S. PATENT DOCUMENTS

| 2,493,351 A | * | 1/1950 | Jones ..................... H01H 37/36 200/83 R |
| 3,180,956 A | | 4/1965 | Lindberg, Jr. |

(Continued)

FOREIGN PATENT DOCUMENTS

| DE | 24 43 991 | 4/1976 |
| DE | 103 52 308 | 6/2005 |

OTHER PUBLICATIONS

International Search Report for PCT application No. PCT/EP2016/073328, dated Dec. 21, 2016, pp. 1-11.

(Continued)

*Primary Examiner* — Natalie Huls
*Assistant Examiner* — Monica S Young
(74) *Attorney, Agent, or Firm* — Saliwanchik, Lloyd & Eisenschenk

(57) ABSTRACT

Method for testing a temperature-compensated, pressure-gradient-controlled pressure switch, which is pneumatically associated with a primary pressure chamber and comprises a secondary pressure chamber for temperature compensation, wherein, by using at least one temperature-control apparatus between the primary pressure chamber and the secondary pressure chamber, a temperature gradient is set which is sufficiently great to produce a pressure gradient between the primary pressure chamber and the secondary pressure chamber that corresponds at least to the triggering pressure gradient of the pressure switch.

20 Claims, 1 Drawing Sheet

(51) Int. Cl.
*G01F 22/00* (2006.01)
*G01M 99/00* (2011.01)
*G01L 27/00* (2006.01)
*H01H 35/24* (2006.01)
*H01H 35/28* (2006.01)
*A62C 3/08* (2006.01)
*A62C 37/50* (2006.01)

(52) U.S. Cl.
CPC ......... *G01M 99/008* (2013.01); *G01R 31/026* (2013.01); *H01H 35/24* (2013.01); *H01H 35/28* (2013.01); *A62C 3/08* (2013.01); *A62C 37/50* (2013.01)

(58) Field of Classification Search
USPC .......................................................... 73/37
See application file for complete search history.

(56) References Cited

U.S. PATENT DOCUMENTS

| | | | |
|---|---|---|---|
| 3,487,348 A | | 12/1969 | Linsalato |
| 3,735,376 A | * | 5/1973 | Kermer ................. A62C 37/50 169/23 |
| 3,946,175 A | | 3/1976 | Sitabkhan |
| 5,578,993 A | * | 11/1996 | Sitabkhan .............. A62C 37/50 340/501 |
| 9,463,344 B2 | * | 10/2016 | Fazzio ................... A62C 37/50 |
| 2006/0174686 A1 | | 8/2006 | McFarland et al. |
| 2008/0127725 A1 | | 6/2008 | Sitabkhan et al. |
| 2008/0282806 A1 | * | 11/2008 | Chakraborty ......... G01L 9/0072 73/718 |
| 2010/0211031 A1 | * | 8/2010 | Hartwell ............. A61M 1/0049 604/319 |

OTHER PUBLICATIONS

Beattie, A.G., "An Acoustic Emission Test for Aircraft Halon 1301 Fire Extinguisher Bottles." *National Technical Information Service (NTIS)*, Apr. 1998.

Examination Report dated May 19, 2016, for corresponding German Application No. 10 2015 220 529.0, in which references U1, U3 and U4 were cited by the German Examiner.

* cited by examiner

METHOD AND DEVICE FOR TESTING A TEMPERATURE-COMPENSATED, PRESSURE-GRADIENT-CONTROLLED PRESSURE SWITCH

CROSS REFERENCE TO A RELATED APPLICATION

This application claims priority under 35 U.S.C. § 119(e) of German Patent Application No. DE 10 2015 220 529.0, filed Oct. 21, 2015, which is incorporated herein by reference in its entirety.

FIELD OF THE INVENTION

The present invention relates to a method and to a corresponding device for testing a temperature-compensated, pressure-gradient-controlled pressure switch, which is pneumatically associated with a primary pressure chamber and comprises a secondary pressure chamber for temperature compensation.

BACKGROUND OF THE INVENTION

The prior art, for example U.S. Pat. No. 3,946,175 A, discloses a temperature-compensated, pressure-gradient-controlled pressure switch. Pressure switches of this type are used in pressurised containers in order to keep the triggering pressure or switching pressure as close as possible to the current operating pressure. If pressurised containers are exposed to large temperature variations, which may be the case for example in fire extinguishers on an aircraft, the operating pressure changes considerably depending on how full it is.

In a pressure switch of this type, it always has to be ensured that it is not triggered unintentionally. In order to ensure this in non-temperature-compensated pressure switches, they are usually designed such that a relatively large ratio is provided between operating pressure and triggering pressure; in non-temperature-compensated pressure switches, this pressure ratio is usually between 2 and 4. If, therefore, the operating pressure is 8 bar, at a pressure ratio of 4 the pressure switch only switches in the event of a drop in pressure to 2 bar.

The pressure switch having temperature compensation known from U.S. Pat. No. 3,946,175 A comprises a secondary pressure chamber, which is filled with the same contents and mass ratios as the primary pressure chamber, such that the thermodynamic behaviour of the primary pressure chamber is identical to that of the secondary pressure chamber, with the exception of the lower volume and the thus lower thermal capacity. The secondary pressure chamber is hermetically separated from the primary pressure chamber by a flexible dividing element. A pressure difference between the primary pressure chamber and the secondary pressure chamber can thus be converted into a translational movement by the flexible dividing element. This movement is then transferred to a carriage, which is provided with a magnet. Owing to the movement of the magnet, a switching mechanism, in this case a Reed switch, can be then actuated.

Furthermore, in U.S. Pat. No. 3,946,175 A the secondary pressure chamber is thermally coupled to the primary pressure chamber so as to ensure that a temperature variation in the primary pressure chamber brings about an approximately identical pressure change in the primary and secondary chamber. The flexible dividing element thus remains substantially in its starting position, such that the carriage is slightly moved thereby in any case. The switching mechanism actuatable by the magnet is not triggered in this state, however.

Reference can thus be made to a virtually temperature-independent pressure switch, which is why the pressure ratio between the operating pressure and the triggering pressure is usually between 1.3 and 1.6. The switching mechanism is therefore actuated even in the event of small drops in pressure if a drop in pressure is caused by a leak in the primary pressurised container, for example. A drop in pressure in the primary pressure chamber due to a drop in temperature in the surroundings does not trigger the switching mechanism, however.

Temperature-compensated, pressure-gradient-controlled pressure switches of this type are used in fire extinguishers in aircraft, for example. In this case, it has to be ensured at regular intervals that the installed pressure switch is still functional.

In the test methods previously known from the prior art, it was necessary to completely empty the primary pressurised container in order to test the pressure switch. However, opening, emptying and refilling the primary pressurised container is complex and expensive. In addition, in this method climate-damaging gases may be emitted, which are released by the filling and emptying process and by the recycling of the contents.

Lastly, a test method of this type has the drawback that the primary pressurised container can be damaged by being taken apart and then welded; a test method of this type cannot be repeated an unlimited number of times either; see BEATTIE, A. G. An Acoustic Emission Test for Aircraft Halon 1301 Fire Extinguisher Bottles, Federal Aviation Administration, Report No. DOT/FAA/AR-97/9, 1998.

Furthermore, U.S. Pat. No. 3,946,175 A discloses a test method in which a switching mechanism, which in this case is formed by the Reed switch, is triggered by a strong external magnetic field. However, only the electronic circuit can be tested using this method. Statements therefore cannot be made on the triggering pressure and the mechanical switching capability of the pressure switch, i.e. on the error-free freedom of movement of the carriage, for example.

The problem addressed by the invention is to provide a method and a corresponding device for more reliably testing the mechanical and electronic functionality of a temperature-compensated, pressure-gradient-controlled pressure switch.

The problem is solved by the features of the independent claims.

According to the basic concept of the invention, a method for testing a temperature-compensated, pressure-gradient-controlled pressure switch, which is pneumatically associated with a primary pressure chamber and comprises a secondary pressure chamber for temperature compensation, is proposed, wherein, by using at least one temperature-control apparatus between the primary pressure chamber and the secondary pressure chamber, a temperature gradient is set which is sufficiently great to produce a pressure gradient between the primary pressure chamber and the secondary pressure chamber that corresponds at least to the triggering pressure gradient of the pressure switch.

According to the invention, selectively heating and/or cooling the primary and/or secondary pressure chamber means that it is made possible for the pressure switch to be triggered due to a temperature gradient being produced. The invention has recognised that temperature gradients of approx. 30 K are usually sufficient to bring about a triggering pressure in common temperature-compensated pressure switches. Depending on the contents, however, the triggering pressure may be reached at smaller or also at greater pressure gradients. Here, the triggering pressure gradient is the relative pressure between the primary pressurised container and an operating pressure at which the switching mechanism in the pressure switch changes the switching state.

Furthermore, the required temperature gradient can be reached within a relatively short time of approx. 30 minutes by the method according to the invention, and the switch can be triggered entirely without any intervention in the system, i.e. without the primary pressure chamber being emptied and refilled.

In addition, the method can carry out both an electronic and a mechanical test of the pressure switch. Preferably, a control apparatus is also provided, which automatically stops the temperature gradient from increasing further when the triggering pressure is reached, so that unnecessary cooling and/or heating can be prevented. The method thus allows efficient, effective and environmentally friendly testing of temperature-compensated pressure switches.

It is proposed that the secondary pressure chamber is heated or cooled by the first temperature-control apparatus. Preferably, the temperature of the primary pressure chamber, i.e. of the chamber filled with a filling medium, is kept constant. The required temperature gradient is therefore preferably reached solely by cooling or heating the secondary pressure chamber. Preferably, the secondary pressure chamber is heated such that the filling medium in the primary pressure chamber is heated considerably more slowly and thus in a delayed manner due to the heating of the secondary pressure chamber, in particular because of the greater mass. The desired temperature gradient thus arises automatically between the primary pressure chamber and the secondary pressure chamber after a certain length of time owing to heating of the secondary pressure chamber.

Preferably, an active cooling or heating element is thermally connected to the primary pressure chamber such that the thermal effects of the first temperature-control apparatus on the primary pressure chamber are compensated for at least in part. Preferably, the active cooling or heating element is arranged to be in direct contact with a surrounding wall forming the primary pressure chamber. Preferably, the active cooling or heating element is also arranged in the spatial proximity of the first temperature-control apparatus, i.e. preferably less than half the distance of the pressure switch from the furthest point on the primary pressure chamber, more preferably less than a third of this distance and particularly preferably less than a tenth of this distance.

An active cooling or heating element is advantageous in particular if sufficient compensation of the temperature effect of the temperature-control apparatus on the primary pressure chamber by the thermal insulation apparatus is not possible.

Also preferably, the primary pressure chamber is cooled or heated by the second temperature-control apparatus. Preferably, cooling is carried out by the second temperature-control apparatus when heating of the secondary pressure chamber is carried out by the first temperature-control apparatus, and vice versa. Owing to the heating, for example of the secondary pressure chamber, and to the cooling of the primary pressure chamber, the required temperature gradient can be reached more rapidly. Preferably, the secondary pressure chamber is heated by the first temperature-control apparatus at the same time as the primary pressure chamber is cooled by the second temperature-control apparatus.

Preferably, the primary pressure chamber is oriented such that a liquid phase of a filling medium contained therein, which phase is formed by $CBrF_3$ for example, has as small as possible a contact surface with the pressure switch, and more preferably there is no contact surface at all. This may for example be achieved by the pressure switch being brought into the highest possible position while the method is being carried out. The invention has recognised that, due to this orientation, the gas phase which preferably largely or completely surrounds the pressure switch assumes the function of an insulating medium. The heat transfer from the pressure switch to the primary pressure chamber can thus be reduced, and therefore the temperature gradient becomes greater overall.

According to the invention, a test device for testing a temperature-compensated, pressure-gradient-controlled pressure switch is proposed, which is pneumatically associated with a primary pressure chamber and comprises a secondary pressure chamber for temperature compensation, wherein a temperature-control apparatus is provided by means of which a temperature gradient between the primary pressure chamber and the secondary pressure chamber can be set, and the pressure switch can be actuated by a pressure gradient caused by the temperature gradient. According to the invention, the test device provides the advantage that the triggering pressure can be generated in a simple manner by producing a temperature gradient between the primary pressure chamber and the secondary pressure chamber.

Preferably, the test device is designed to set a temperature difference of at least 10 K between the primary pressure chamber and the secondary pressure chamber, more preferably of at least 20 K and particularly preferably of greater than 30 K. These temperature gradients are required for building up a sufficient pressure gradient that corresponds to the triggering pressure of the pressure switch.

Also preferably, a first temperature-control apparatus is designed to cool or heat a surrounding wall of the secondary pressure chamber in a targeted manner. Preferably, the temperature-control apparatus is flexibly and adaptably designed, so that there is as large as possible a contact surface between the first temperature-control apparatus and the pressure switch. Within the meaning of this invention, targeted heating is understood to mean that greater than 50% of the thermal energy output by the temperature-control apparatus can be transferred to the pressure switch, more preferably greater than 70% and particularly preferably greater than 90%. Preferably, targeted heating is also understood to mean geometric adaptation of the temperature-control apparatus to the geometry of the object to be heated. The same applies to the term targeted cooling, where at least 50% of the thermal energy absorbed by the temperature-control apparatus is absorbed by the object to be cooled, more preferably greater than 70% and particularly preferably greater than 90%.

Preferably, the first temperature-control apparatus is formed by a silicone heating mat, which preferably has a power of between 10 and 30 W, more preferably of less than 20 W. Owing to the flexible design of the temperature-control apparatus, the best possible heat transfer from the first temperature-control apparatus, via the surrounding wall forming the secondary pressure chamber into the secondary pressure chamber itself, is made possible. Because the pressure switch usually projects largely into the primary pressure chamber, said switch is only accessible to a limited extent. Preferably, the first temperature-control apparatus is therefore designed to be attached to the part of the pressure switch positioned on the outside of the primary pressure chamber. Preferably, the temperature-control apparatus is attached to the pressure switch by an attachment element, for example by a tensioning element, a clamp or a screw clamp.

It is also proposed that a second temperature-control apparatus is designed to cool or heat a surrounding wall of the primary pressure chamber in a targeted manner. Since the first temperature-control apparatus is preferably designed to heat the secondary pressure chamber, the second temperature-control apparatus is preferably designed to cool the primary pressure chamber. In this case, it has proven advantageous for the second temperature-control apparatus to form a contact surface with the surrounding wall of the primary pressure chamber. Advantageously, the contact surface is arranged on the side of the primary pressure chamber opposite the first temperature-control apparatus. The first, heating temperature-control apparatus is therefore arranged as far away as possible from the second, cooling temperature-control apparatus. More preferably, the second temperature-control apparatus is arranged such that the liquid phase of a filling medium within the primary pressure chamber covers the surface on the inside of the surrounding wall, which is directly opposite the second temperature-control apparatus. It is thus ensured that heat is transferred from the second temperature-control apparatus through the surrounding wall to the liquid phase of the filling medium, as a result of which the primary pressure chamber can be cooled more efficiently.

In addition, a thermal insulation apparatus is proposed which surrounds the outer surface of the surrounding wall. This is particularly advantageous if a second temperature-control apparatus only surrounds part of the surrounding wall and therefore the rest of the surrounding wall is heated by ambient heat. This negative effect can be prevented by the insulation effect.

Lastly, a first sensor apparatus is provided to determine the temperature of a surrounding wall of the secondary pressure chamber and/or a second sensor apparatus is provided to determine the temperature of a surrounding wall of the primary pressure chamber. The temperature sensors can be used to produce input data for a control apparatus. Therefore, for example, the cooling and/or heating power can be reduced if an excessively high or excessively low temperature is detected.

It is advantageous for a detection apparatus to be provided to determine the fill level of the primary pressure chamber. Preferably, the detection apparatus may be formed by an ultrasonic measuring appliance or by a mass determination apparatus. Knowledge of the fill level within the primary pressure chamber together with the temperature data at various points in the primary pressurised container makes it possible to calculate the temperature distribution within the primary pressurised container on the basis of a thermodynamic fluid model. On the basis of this temperature distribution, a pressure ratio can in turn be calculated that makes it possible to draw a conclusion on the precise triggering pressure gradient of the pressure switch.

It is also advantageous for a continuity tester to be provided to determine the switching state of the pressure switch. A multimeter that is connected to the actual switching mechanism of the pressure switch by an electronic line may be used as continuity tester, for example. If said switch is opened or closed, this can be detected by the continuity tester. Preferably, the continuity tester is connected to the control apparatus by means of signals, so that the test process can be influenced depending on the switch position. Therefore, for example, the secondary pressure chamber can only be heated until the continuity tester detects that the switching state has changed. Unnecessary thermal loading is thus prevented.

BRIEF DESCRIPTION OF THE DRAWINGS

The invention is explained in the following on the basis of preferred embodiments with reference to the accompanying drawings, in which.

DETAILED DESCRIPTION OF THE DRAWINGS

Figure 1:
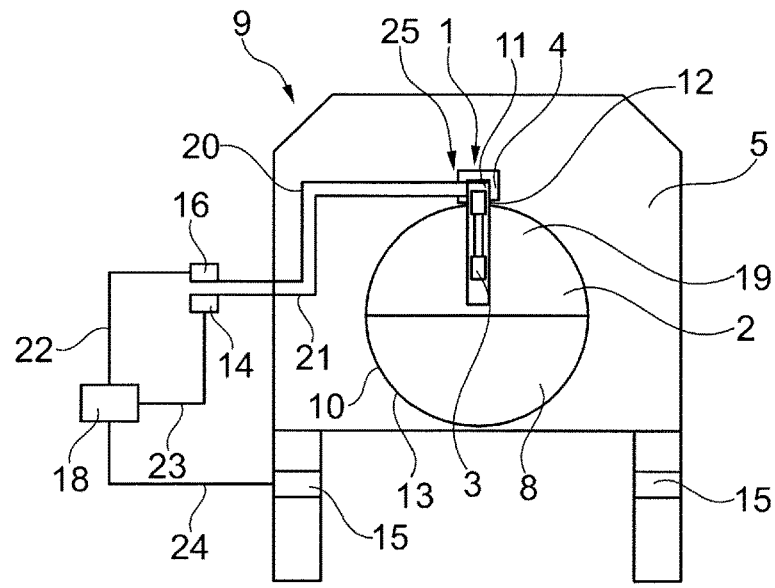
FIG. 1 shows a first embodiment of a test device according to the invention in which the second temperature-control apparatus is formed by a thermal chamber.

FIG. 1 shows a first embodiment of a test device 9 according to the invention which is substantially formed by a pressurised container 25, a first temperature-control apparatus 4 and a second temperature-control apparatus 5.

The pressurised container 25 may for example be formed by a fire extinguisher, a primary pressure chamber 2 being formed by a surrounding wall 10. Furthermore, the pressurised container 25 comprises a temperature-compensated, pressure-gradient-controlled pressure switch 1, which comprises a secondary pressure chamber 3. The pressure switch 1 is connected to the surrounding wall 10 by a flange. The pressure switch 1 further comprises a switching mechanism of which the switching state changes if a predetermined pressure ratio between the pressure in the primary pressure chamber 2 and an operating pressure is exceeded.

The temperature of the pressure switch 1 is compensated by the secondary pressure chamber 3 being thermally operatively connected to the primary pressure chamber 2.

Therefore, in the event of a drop in temperature in the primary pressure chamber 2, the temperature in the secondary pressure chamber 3 also drops, which is why a corresponding drop in pressure also occurs in both pressure chambers 2 and 3 due to them being filled with an identical filling medium 8 and 19. Therefore, a temperature-induced drop in temperature in the primary pressure chamber 2 does not cause a change in the switching state of the switching mechanism; therefore, the pressure switch 1 is temperature-compensated.

The basic concept of the present invention is that, by selectively cooling or heating the primary pressure chamber 2 and/or the secondary pressure chamber 3, a temperature gradient is produced between the primary pressure chamber 2 and the secondary pressure chamber 3, which in turn causes a pressure gradient between the primary pressure chamber 2 and the secondary pressure chamber 3. In this case, the pressure gradient produced by the test device 9 has to exceed the pressure ratio that triggers the switching mechanism.

In the embodiment from FIG. 1, the temperature difference is produced by the first temperature-control apparatus 4. Preferably, this is a heating temperature-control apparatus 4, which is also preferably formed by a silicone heating mat. The first temperature-control apparatus 4 may preferably also be formed by a heat accumulator, by any other electrical heating element, by a heating element through which a heating means flows or by a radiating heating element. Preferably, the first temperature-control apparatus 4 has a heating or cooling power of between 10 and 60 W, more preferably of between 15 and 25 W.

The pressure switch 1 largely projects into the primary pressure chamber 2, and therefore the first temperature-control apparatus 4 has to be designed to allow the best possible heat transfer to the part of the pressure switch 1 accessible from the outside. The first temperature-control apparatus 4 is therefore preferably designed to thermally cooperate with the part of the pressure switch 1 outside the primary pressure chamber 2, i.e. a pressure switch housing 11. Preferably, the pressure switch housing 11 forms the surrounding wall 11 of the secondary pressure chamber 3.

The thermal energy is transferred to the secondary pressure chamber 3 and the filling medium 19 contained therein via the pressure switch housing 11. Owing to the thermal inertia of the first primary pressure chamber 2, the first temperature-control apparatus 4 only heats the primary pressure chamber 2 to a considerably lesser extent compared with the secondary pressure chamber 3. A temperature difference between the primary and secondary pressure chambers 2 and 3 can therefore be set, as a result of which a pressure gradient also arises between the two pressure chambers 2 and 3.

In the embodiment shown in FIG. 1, in addition to the first temperature-control apparatus 4 the second temperature-control apparatus 5 is provided, which in this case is preferably formed by a thermal chamber. This is preferably a cooling thermal chamber designed to receive the entire pressurised container 25. In this case, the second temperature-control apparatus 5 almost completely cools the surrounding wall 10 of the primary pressure chamber 2, and therefore the filling medium 8, 19 is also cooled as a result. Therefore, the second temperature-control apparatus 5 can further increase the temperature gradient or can set a temperature gradient that could not be set by the first temperature-control apparatus 4 alone.

Preferably, the pressurised container 25 is oriented such that the pressure switch 1 is arranged in the highest possible position. If this a spherical primary pressure chamber 2, the pressurised container 25 is preferably oriented such that the pressure switch 1 forms the uppermost pole. As can be seen in FIG. 1, due to this orientation of the pressurised container 25 the pressure switch 1 can be completely surrounded by the gas phase 19 of the filling medium, i.e. the liquid phase 8 of the filling medium is not in contact with the pressure switch 1. Because the gas phase 19 is not in contact with the pressure switch 1, it has a thermally insulating effect, such that only a very small proportion of the thermal energy output by the first temperature-control apparatus 4 to the pressure switch 1 is transferred to the filling medium 8 and 19. Therefore, the thermal energy transferred to the pressure switch 1 is largely used to heat the secondary pressure chamber 3, as a result of which a greater temperature gradient between the primary pressure chamber 2 and the secondary pressure chamber 3 arises overall.

Lastly, it may also be expedient to orient the pressurised container 25 in the above-described manner if the primary pressure chamber 2 is filled to the extent that the liquid phase 8 of the filling medium contacts the pressure switch 1 irrespective of the orientation of the pressurised container 25, since here, too, the contact surface between the pressure switch 1 and the liquid phase 8 of the filling medium is decreased, and therefore the transfer of heat is also reduced to a minimum.

Furthermore, in the first embodiment from FIG. 1, a first sensor apparatus 12 is provided which is preferably arranged at a contact point between the first temperature-control apparatus 4 and the pressure switch 1. More preferably, the sensor apparatus is also arranged on the flange of the pressure switch 1, which is used to attach the pressure switch 1 to the surrounding wall 10.

If a first temperature-control apparatus 4 is formed by a silicone heating mat, the first sensor apparatus 12 may preferably be integrated into the silicone heating mat. By means of the first sensor apparatus 12, which is preferably formed by a temperature-measuring apparatus, e.g. by a PT100 sensor, the surface temperature of the pressure switch housing 11 can be monitored and thus the pressure switch 1 can be prevented from being thermally overloaded.

Alternatively or additionally, a second sensor apparatus 13 can also be provided to monitor the temperature of the primary pressure chamber 2. Preferably, the second sensor apparatus 13 is arranged on the surrounding wall 10 of the primary pressure chamber 2, more preferably at a point on the primary pressure chamber 2 opposite the pressure switch 1. By means of the two measuring points of the first and second sensor apparatus 12 and 13, the temperature gradient and thus also the pressure gradient between the primary pressure chamber 2 and the secondary pressure chamber 3 can be approximately determined.

Furthermore, a detection apparatus 15 for determining the masses and/or volumes of the liquid and gas phases 8 and 19 of the filling medium can be provided. The values determined by the detection apparatus 15 can be used together with a thermodynamic fluid model in order to calculate the nominal state of the primary and secondary pressure chamber 2 and 3. In this way, more precise statements can be made on the thermodynamic conditions at the triggering time of the switching mechanism, as a result of which the functionality of the pressure switch 1 can be assessed more reliably as a whole. In this embodiment, the detection apparatus 15 is preferably formed by a mass-determination apparatus, which is only shown schematically in FIG. 1. Any other arrangement of the detection apparatus 15 is likewise conceivable.

In addition, a heating controller 16 is provided, which is connected to the first temperature-control apparatus 4 by a connection line 20. The heating controller 16 is thus used to set the heating power.

In addition, a continuity tester 14 is preferably provided, which is electrically connected to the pressure switch 1 by a connection line 21 and can detect the switching state that the switching mechanism is in. Preferably, the continuity tester 14 is formed by a multimeter.

Preferably, a control apparatus 18 is additionally provided, which is preferably connected to the heating controller 16, the continuity tester 14 and/or the detection apparatus 15 by connection lines 22, 23 and 24 by way of signals. In this case, the control apparatus 18 is preferably designed to carry out the test sequence automatically. The control apparatus 18 may for example give the heating controller 16 the signal to activate the first temperature-control apparatus 4 for a heating process. This preferably takes place until the continuity tester 14 has detected a change in the switching state of the switching mechanism and has made this information available to the control apparatus 18 by means of the connection line 23. The additional heating by the first temperature-control apparatus 4 is therefore stopped, such that the secondary pressure chamber 3 cools and, as a result of equalisation of the temperatures in the primary and secondary pressure chamber 2 and 3, the original switching state of the switching mechanism is re-established. Therefore, a switching hysteresis of the switching mechanism can also be determined, i.e. at which point in time or at which pressure gradient the switching mechanism is switched from a first switching state into a second switching state and back again.

Preferably, the first and/or second sensor apparatus 12 and/or 13 can be connected to the control apparatus 18 by way of signals. The temperature can thus be monitored during the entire test sequence in order to prevent thermal overloading at the pressurised container 25.

Preferably, the information from the detection apparatus 15 can also be processed, for example in order to obtain more precise statements on the thermodynamic conditions during the change in the switching states in combination with the temperature values from the first and second sensor apparatus 12 and 13. These values may for example be stored on a data carrier or another storage medium that is specific to the pressurised container 25 to be tested in each case, so that it is also possible to archive the test results.

If a control apparatus 18 is omitted, the first and/or second temperature-control apparatus 4 and/or 5 can also be deactivated manually or automatically after a preset time has elapsed.

The control apparatus 18 shown in FIG. 1 may alternatively also assume the function of the heating controller 16 and/or the continuity tester 14.

Figure 2:
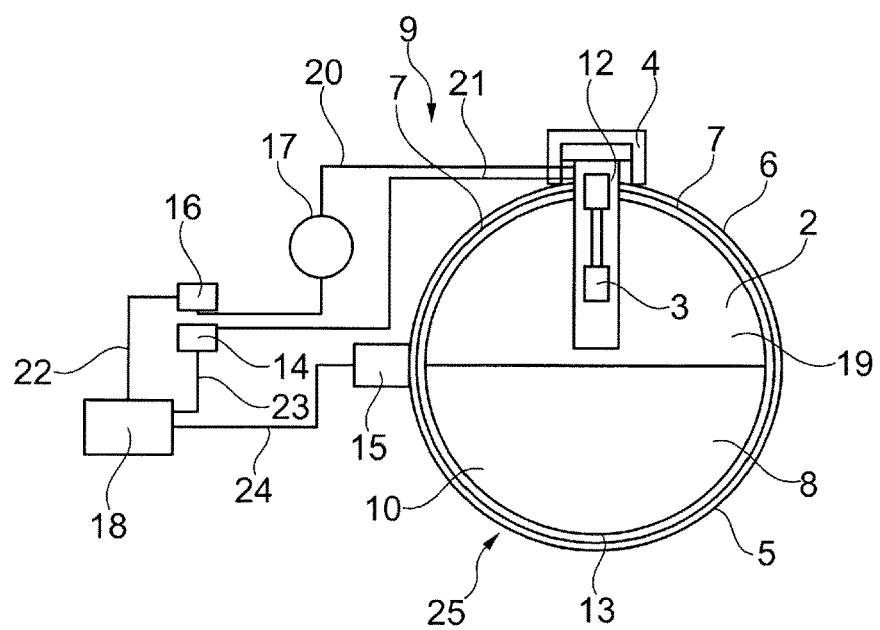
FIG. 2 shows a second embodiment of a test device according to the invention in which the second temperature-control apparatus is formed by a planar cooling element.

FIG. 2 shows a second embodiment of the invention, which has a similar structure to the first embodiment from FIG. 1. The major difference between these embodiments is that the second temperature-control apparatus 5 is not formed by a thermal chamber but preferably by a cooling element in direct contact with the surrounding wall 10 of the primary pressure chamber 2.

Preferably, this is a planar cooling element which is or can be adapted to the contour of the surrounding wall 10, has a high coefficient of thermal conduction, and is made of copper, for example. Alternatively, direct liquid cooling by means of a cooling circuit or direct cooling by liquid nitrogen are also possible.

The contact surface between the second temperature-control apparatus 5 and the surrounding wall 10 may be a different size depending on the required temperature gradient. Therefore, for a spherical geometry of the pressurised container, for example only the lower pole, the lower half or the entire surrounding wall 10 can be cooled. The thermal conductivity may preferably be improved by a thermally conductive mass, and this also applies to the contact surface between the first temperature-control apparatus 4 and the pressure switch 1.

Furthermore, it can be seen from FIG. 2 that the part of the surrounding wall 10 that is not surrounded by the second temperature-control apparatus 5 is preferably surrounded by a thermal insulation apparatus 6. The cooling of the primary pressure chamber 2 carried out by the second temperature-control apparatus 5 can thus be prevented from being reduced by the ambient heat energy being absorbed through the surrounding wall 10. Preferably, the thermal insulation apparatus 6 can additionally also surround the part of the pressure switch 1 projecting from the primary pressure chamber 2.

Lastly, an active cooling or heating element 7 can be provided that is designed to reduce or compensate for the undesired thermal effect of the first temperature-control apparatus 4 on the primary pressure chamber 2. If the first temperature-control apparatus 4 is designed as a thermal element, the active cooling or heating element 7 is designed as a cooling element, and vice versa. The cooling element is preferably liquid-cooled.

For the best possible effect, the active cooling or heating element 7 is arranged as close as possible to the first temperature-control apparatus 4, i.e. at a distance of less than 100 mm from the flange of the pressure switch 1, more preferably of less than 50 mm and yet more preferably of less than 20 mm.

Furthermore, it has proven advantageous for the active cooling or heating element 7 to annularly surround the first temperature-control apparatus 4, such that the unimpeded transfer of heat into the remote or lower region of the surrounding wall 10 of the primary pressure chamber 2 can be prevented.

In practice, it has been shown that by means of the combination of the thermal insulation apparatus 6 with the active cooling element 7, thermal decoupling of the heating brought about by the first temperature-control apparatus 4 from the cooling produced by the second temperature-control apparatus 5 can be achieved, and this results in a greater capacity of the test device 9 for the purpose of a greater temperature gradient.

Another difference compared with the first embodiment in FIG. 1 is that a power-measuring apparatus 17 is provided, which is used to monitor the heating or cooling power preferably of the first temperature-control apparatus 4. Alternatively or additionally, the power-measuring apparatus 17 can also be associated with the second temperature-control apparatus 5.

Lastly, there is also a difference in the detection apparatus 15, which is formed by an ultrasonic measuring apparatus in the second embodiment.

Any combination of the embodiments shown in FIG. 1 and FIG. 2 should be included in the disclosure of this application.

In addition, the disclosure of this application is not limited to the embodiments which are described in the preceding examples from FIG. 1 and FIG. 2 and in which the first temperature-control apparatus 4 is designed as a heating element and the second temperature-control apparatus 5 is designed as a cooling element. It is also possible to produce a temperature gradient in the reverse manner, i.e. by the first temperature-control apparatus 4 being a cooling element and the second temperature-control apparatus 5 being a thermal element.

Furthermore, modifications to the embodiments shown in FIG. 1 and FIG. 2 in which only a first or only a second temperature-control apparatus 4 or 5 is provided should expressly be included in the disclosure of this application.

Embodiment 1

Method for testing a temperature-compensated, pressure-gradient-controlled pressure switch (1), which is pneumatically associated with a primary pressure chamber (2) and comprises a secondary pressure chamber (3) for temperature compensation, characterised in that, by using at least one temperature-control apparatus (4, 5) between the primary pressure chamber (2) and the secondary pressure chamber (3), a temperature gradient is set which is sufficiently great to produce a pressure gradient between the primary pressure chamber (2) and the secondary pressure chamber (3) that corresponds at least to the triggering pressure gradient of the pressure switch (1).

Embodiment 2

Method according to Embodiment 1, characterised in that the secondary pressure chamber (3) is heated or cooled by the first temperature-control apparatus (4).

Embodiment 3

Method according to Embodiment 2, characterised in that an active cooling or heating element (7) is thermally connected to the primary pressure chamber (2) such that the thermal effects of the first temperature-control apparatus (4) on the primary pressure chamber (2) are compensated for at least in part.

Embodiment 4

Method according to any of the preceding Embodiments, characterised in that the primary pressure chamber (2) is cooled or heated by the second temperature-control apparatus (5).

Embodiment 5

Method according to claim 4 with reference to any of Embodiments 2 to 3, characterised in that the secondary pressure chamber (3) is heated by the first temperature-control apparatus (4) and the primary pressure chamber (2) is simultaneously cooled by the second temperature-control apparatus (5).

Embodiment 6

Method according to any of the preceding Embodiments, characterised in that the primary pressure chamber (2) is oriented such that a liquid phase of a filling medium (8) contained therein has as small as possible a contact surface with the pressure switch (1).

Embodiment 7

Test device (9) for testing a temperature-compensated, pressure-gradient-controlled pressure switch (1), which is pneumatically associated with a primary pressure chamber (2) and comprises a secondary pressure chamber (3) for temperature compensation, characterised in that a temperature-control apparatus (4, 5) is provided by means of which a temperature gradient between the primary pressure chamber (2) and the secondary pressure chamber (3) can be set, and the pressure switch (1) can be actuated by a pressure gradient caused by the temperature gradient.

Embodiment 8

Test device (9) according to Embodiment 7, characterised in that the test device (9) is designed to set a temperature difference of at least 10 K between the primary pressure chamber (2) and the secondary pressure chamber (3).

Embodiment 9

Test device (9) according to either Embodiment 7 or Embodiment 8, characterised in that a first temperature-control apparatus (4) is designed to cool or heat a surrounding wall (11) of the secondary pressure chamber (3) in a targeted manner.

Embodiment 10

Test device (9) according to Embodiment 9, characterised in that the first temperature-control apparatus (4) is formed by a silicone heating mat.

Embodiment 11

Test device (9) according to any of Embodiments 7 to 10, characterised in that a second temperature-control apparatus (5) is designed to cool or heat a surrounding wall (10) of the primary pressure chamber (2) in a targeted manner.

Embodiment 12

Test device (9) according to any of Embodiments 7 to 11, characterised in that a thermal insulation apparatus (6) surrounds the outer surface of the surrounding wall (10).

Embodiment 13

Test device (9) according to any of Embodiments 7 to 12, characterised in that a first sensor apparatus (12) is provided to determine the temperature of a surrounding wall (11) of the secondary pressure chamber (3) and/or a second sensor apparatus (13) is provided to determine the temperature of a surrounding wall (10) of the primary pressure chamber (2).

Embodiment 14

Test device (9) according to any of Embodiments 7 to 13, characterised in that a detection apparatus (15) is provided to determine the fill level of the primary pressure chamber (2).

Embodiment 15

Test device (9) according to any of Embodiments 7 to 14, characterised in that a continuity tester (14) is provided to determine the switching state of the pressure switch (1).

The invention claimed is:
1. A method for testing a temperature-compensated, pressure-gradient-controlled pressure switch, comprising:
providing a temperature-compensated, pressure-gradient-controlled pressure switch,
wherein the temperature-compensated, pressure-gradient-controlled pressure switch comprises a secondary pressure chamber, and
wherein the temperature-compensated, pressure-gradient-controlled pressure switch is configured to pneumatically interconnect with a primary pressure chamber such that when a pressure gradient between a primary pressure of the primary pressure chamber and a secondary pressure of the secondary pressure chamber is equal to or greater than a triggering pressure gradient, the temperature-compensated, pressure-gradient-controlled pressure switch switches;
pneumatically interconnecting the temperature-compensated, pressure-gradient-controlled pressure switch with the primary pressure chamber such that when the pressure gradient between the primary pressure of the primary pressure chamber and the secondary pressure of the secondary pressure chamber is equal to or greater than the triggering pressure gradient, the temperature-compensated, pressure-gradient-controlled pressure switch switches,
wherein pneumatically interconnecting the temperature-compensated, pressure-gradient-controlled pressure switch with the primary pressure chamber comprises:
interconnecting the temperature-compensated, pressure-gradient-controlled pressure switch with the primary pressure chamber such that at least a portion of the temperature-compensated, pressure-gradient-controlled pressure switch is positioned within the primary pressure chamber;
thermally coupling at least one temperature-control apparatus with:
the temperature-compensated, pressure-gradient-controlled pressure switch, which is thermally coupled to the secondary pressure chamber; and/or
the primary pressure chamber;
orienting the primary pressure chamber at a first orientation of the primary pressure chamber, such that a liquid phase of a two-phase filling medium contained within the primary pressure chamber has a first contact surface with the temperature-compensated, pressure-gradient-controlled pressure switch, and
wherein the first contact surface is smaller than or equal to a corresponding contact surface of the liquid phase of the two-phase filling medium contained within the primary pressure chamber with the temperature-compensated, pressure-gradient-controlled pressure switch for any other orientation of the primary pressure chamber; and
while orienting the primary pressure chamber at the first orientation of the primary pressure chamber, performing, via the at least one temperature-control apparatus, one of more of the following:
(i) heating the primary pressure chamber;
(ii) cooling the primary pressure chamber;
(iii) heating the secondary pressure chamber; and
(iv) cooling the secondary pressure chamber,
such that a temperature gradient is created between a primary temperature of the primary pressure chamber and a secondary temperature of the secondary pressure chamber that is sufficient to cause the pressure gradient between the primary pressure of primary pressure chamber and the secondary pressure of the secondary pressure chamber to be equal to or greater than the triggering pressure gradient.

2. The method according to claim 1,
wherein the method comprises:
heating the secondary pressure chamber via a first temperature-control apparatus of the at least one temperature-control apparatus; or
cooling the secondary pressure chamber via a first temperature-control apparatus of the at least one temperature-control apparatus.

3. The method according to claim 2, further comprising:
thermally coupling a second temperature-control apparatus of the at least one temperature-control apparatus with the primary pressure chamber,
wherein the second temperature-control apparatus of the at least one temperature-control apparatus is an active cooling element or an active heating element; and
compensating for thermal effects of the first temperature-control apparatus of the at least one temperature-control apparatus on the primary pressure chamber, at least in part, via the second temperature-control apparatus of the at least one temperature-control apparatus.

4. The method according to claim 2,
wherein the method comprises:
heating the secondary pressure chamber via the first temperature-control apparatus of the at least one temperature-control apparatus, and
wherein the method further comprises:
thermally coupling a second temperature-control apparatus of the at least one temperature-control apparatus with the primary pressure chamber,
wherein the second temperature-control apparatus of the at least one temperature-control apparatus is an active cooling element; and
cooling the primary pressure chamber via the second temperature-control apparatus of the at least one temperature-control apparatus.

5. The method according to claim 2,
wherein the method comprises:
cooling the secondary pressure chamber via the first temperature-control apparatus of the at least one temperature-control apparatus, and
wherein the method further comprises:
thermally coupling a second temperature-control apparatus of the at least one temperature-control apparatus with the primary pressure chamber,
wherein the second temperature-control apparatus of the at least one temperature-control apparatus is an active heating element; and
heating the primary pressure chamber via the second temperature-control apparatus of the at least one temperature-control apparatus.

6. The method according to claim 2,
wherein the method comprises heating the secondary pressure chamber via the first temperature-control apparatus of the at least one temperature-control apparatus,
wherein the method further comprises:
cooling the primary pressure chamber via a second temperature-control apparatus of the at least one temperature-control apparatus simultaneously with heating the secondary pressure chamber via the first temperature-control apparatus of the at least one temperature-control apparatus, such that thermal effects of the first temperature-control apparatus of the at least one temperature-control apparatus on the primary pressure chamber are substantially compensated for.

7. The method according to claim 1,
wherein the method comprises:
heating the secondary pressure chamber via a first temperature-control apparatus of the at least one temperature-control apparatus.

8. A test device for testing a temperature-compensated, pressure-gradient-controlled pressure switch, comprising:
at least one temperature-control apparatus,
wherein the at least one temperature-control apparatus is interconnected with a temperature-compensated, pressure-gradient-controlled pressure switch having a secondary pressure chamber,
wherein the temperature-compensated, pressure-gradient-controlled pressure switch is pneumatically interconnected with a primary pressure chamber such that when a pressure gradient between a primary pressure of the primary pressure chamber and a secondary pressure of the secondary pressure chamber is equal to or greater than a triggering pressure gradient, the temperature-compensated, pressure-gradient-controlled pressure switch switches,
wherein the temperature-compensated, pressure-gradient-controlled pressure switch is pneumatically interconnected with a primary pressure chamber so that the temperature-compensated, pressure-gradient-controlled pressure switch is interconnected with the primary pressure chamber such that at least a portion of the temperature-compensated, pressure-gradient-controlled pressure switch is positioned within the primary pressure chamber, wherein the at least one temperature-control apparatus is thermally coupled with:

the temperature-compensated, pressure-gradient-controlled pressure switch, which is thermally coupled to the secondary pressure chamber; and/or the primary pressure chamber, and wherein the test device is configure such that the primary pressure chamber is orientable at a first orientation of the primary pressure chamber, such that a liquid phase of a two-phase filling medium contained within the primary pressure chamber has a first contact surface with the temperature-compensated, pressure-gradient-controlled pressure switch, and wherein the first contact surface is smaller than or equal to a corresponding contact surface of the liquid the two-phase filling medium contained within the primary pressure chamber with the temperature-compensated, pressure-gradient-controlled pressure switch for any other orientation of the primary pressure chamber; and wherein, while orienting the primary pressure chamber at the first orientation of the primary pressure chamber, the at least one temperature-control apparatus performs one or more of the following:

(i) heats the primary pressure chamber;
(ii) cools the primary pressure chamber;
(iii) heats the secondary pressure chamber; or
(iv) cools the secondary pressure chamber;

such that a temperature gradient is created between a primary temperature of the primary pressure chamber and a secondary temperature of the secondary pressure chamber that is sufficient to cause the pressure gradient between the primary pressure of primary pressure chamber and the secondary pressure of the secondary pressure chamber to be equal to or greater than the triggering pressure gradient.

9. The test device according to claim 8, wherein the test device is configured to cause the temperature difference to be at least 10 K between the primary temperature of the primary pressure chamber and the secondary temperature of the secondary pressure chamber.

10. The test device according to claim 8, wherein a first temperature-control apparatus of the at least one temperature-control apparatus:

cools a surrounding wall of the secondary pressure chamber in a targeted manner; or heats a surrounding wall of the secondary pressure chamber in a targeted manner.

11. The test device according to claim 10, wherein the first temperature-control apparatus of the at least one temperature-control apparatus heats a surrounding wall of the secondary pressure chamber in a targeted manner, and wherein a second temperature-control apparatus of the at least one temperature-control apparatus cools a surrounding wall of the primary pressure chamber in a targeted manner.

12. The test device according to claim 10, wherein the first temperature-control apparatus of the at least one temperature-control apparatus cools a surrounding wall of the secondary pressure chamber in a targeted manner, and wherein a second temperature-control apparatus of the at least one temperature-control apparatus heats a surrounding wall of the primary pressure chamber in a targeted manner.

13. The test device according to claim 8, wherein the first temperature-control apparatus of the at least one temperature-control apparatus is formed by a silicone heating mat.

14. The test device according to claim 8, wherein a second temperature-control apparatus of the at least one temperature-control apparatus:

cools a surrounding wall of the primary pressure chamber in a targeted manner; or heats a surrounding wall of the primary pressure chamber in a targeted manner.

15. The test device according to claim 8, further comprising:

a thermal insulation apparatus, wherein the thermal insulation apparatus surrounds an outer surface of the surrounding wall of the primary pressure chamber.

16. The test device according to claim 8, further comprising:

a first sensor apparatus, wherein the first sensor apparatus determines a temperature of the surrounding wall of the secondary pressure chamber.

17. The test device according to claim 16, further comprising:

a second sensor apparatus, wherein the second sensor apparatus determines a temperature of the surrounding wall of the primary pressure chamber.

18. The test device according to claim 8, further comprising:

a detection apparatus, wherein the detection apparatus determines a fill level of a filling medium contained in the primary pressure chamber.

19. The test device according to claim 8, further comprising:

a continuity tester, wherein the continuity tester determines a switching state of the temperature-compensated, pressure-gradient-controlled pressure switch.

20. The test device according to claim 8, further comprising:

a pressurized container, where the primary pressure chamber is formed by a surrounding wall of the pressurized container.

* * * * *